US007433476B2

(12) United States Patent
Wildhagen et al.

(10) Patent No.: US 7,433,476 B2
(45) Date of Patent: Oct. 7, 2008

(54) AUTOMATIC GAIN CONTROL

(75) Inventors: Jens Wildhagen, Weinstadt (DE);
Carsten Merkle, Welzheim (DE);
Dietmar Schill, Winnenden (DE); **Rolf
Nöthlings, Stuttgart (DE); Taiwa
Okanobu**, Tokyo (JP)

(73) Assignee: Sony Deutschland GmbH, Cologne (DE)

( * ) Notice: Subject to any disclaimer, the term of this patent is extended or adjusted under 35 U.S.C. 154(b) by 697 days.

(21) Appl. No.: 10/253,323

(22) Filed: Sep. 24, 2002

(65) Prior Publication Data
US 2003/0059065 A1    Mar. 27, 2003

(30) Foreign Application Priority Data
Sep. 25, 2001    (EP) ................... 01122979

(51) Int. Cl.
*H03G 3/00*    (2006.01)

(52) U.S. Cl. ...................................... 381/107

(58) Field of Classification Search ......... 381/106–108, 381/104, 98, 1–2, 119, 102, 109, 56, 58–59, 381/321, 120; 330/278–279, 282; 84/672; 455/245.1

See application file for complete search history.

(56) References Cited

U.S. PATENT DOCUMENTS

| 5,050,217 | A | * | 9/1991 | Orban | ................. | 381/94 |
| 5,444,788 | A | * | 8/1995 | Orban | ................. | 381/106 |
| 5,617,060 | A | * | 4/1997 | Wilson et al. | ........... | 330/129 |
| 5,680,075 | A | * | 10/1997 | Sacca | ................. | 330/279 |
| 5,892,834 | A | * | 4/1999 | Smart et al. | ........... | 381/106 |
| 6,843,597 | B1 | * | 1/2005 | Li et al. | .............. | 375/345 |
| 7,076,225 | B2 | * | 7/2006 | Li et al. | .............. | 455/245.1 |

FOREIGN PATENT DOCUMENTS

EP    0 630 106    12/1994
EP    1 061 653    12/2000

OTHER PUBLICATIONS

K. Mclaning et al., "Radio Receiver Design", Noble Publishing Corporation, Atlanta, 2000, pp. 691-695.

* cited by examiner

*Primary Examiner*—Vivian Chin
*Assistant Examiner*—Lun-See Lao
(74) *Attorney, Agent, or Firm*—Oblon, Spivak, McClelland, Maier & Neustadt, P.C.

(57) ABSTRACT

In an automatic gain control unit, the gain of a voltage-controlled amplifier (VCA) (25) is regulated with a closed-loop control circuit. The time constant of the control circuit is varied dependent on the magnitude (31) of the VCA output signal. As long as the magnitude (31) of the VCA output signal is small, the gain is slowly adjusted. In case the magnitude (31) of the VCA becomes so large that saturation of the analog-digital converter (28) might occur, the time constant of the control circuit is decreased, in order to allow for a quick adjustment of the amplifier's gain.

18 Claims, 3 Drawing Sheets

AUTOMATIC GAIN CONTROL

The invention is related to an automatic gain control unit comprising a voltage-controlled amplifier, whereby the gain of said voltage-controlled amplifier is controlled by a closed-loop control circuit, and to a receiver comprising an automatic gain control unit. Furthermore, the invention is related to a method for controlling the gain of a voltage-controlled amplifier.

In an automatic gain control unit, an amplifier's gain is regulated by means of a closed-loop control circuit. The gain is controlled such that the magnitude of the amplifier's output signal is about equal to a given reference magnitude. The closed-loop control circuit transforms the deviation of the amplifier's output signal amplitude into a corresponding gain control signal.

Technical background with respect to automatic gain control units can be found in "Radio receiver design" by K. McClaning and T. Vito, Noble Publishing Corporation, Atlanta, 2000.

A critical parameter when designing an automatic gain control unit is the control rate of the closed-loop control circuit. In case the control rate is set to a high value, the gain is adjusted quickly. Regulating the gain too quickly causes distortions of the amplified signal, though, because the amplitude modulation might be partly compensated. On the other hand, if only a slow variation of the gain is allowed, a rise of the signal magnitude will cause saturation errors, and especially the analog-digital converter will saturate.

It is an object of the invention to provide an automatic gain control unit and a method for controlling the gain of a voltage-controlled amplifier, whereby the risk of analog-digital converter (ADC) saturation is reduced.

The object of the invention is solved by an automatic gain control unit according to claim 1, by a receiver according to claim 12, and by a method for controlling the gain of a voltage-controlled amplifier according to claim 14.

According to the invention, the automatic gain control unit comprises a voltage-controlled amplifier (VCA) which amplifies a VCA input signal in order to obtain a VCA output signal, whereby the gain of said voltage-controlled amplifier is controlled by a closed-loop control circuit. The automatic gain control unit comprises means for generating an error signal by comparing the magnitude of the VCA output signal with a predefined reference magnitude, and a forward controlling element which transforms the error signal into a gain control signal for the voltage-controlled amplifier. Furtheron, the automatic gain control unit comprises means for varying the control rate of the closed-loop control circuit according to the magnitude of the VCA output signal, whereby the control rate is increased with increasing magnitude of the VCA output signal.

The error signal indicates how much the magnitude of the VCA output signal deviates from the reference magnitude. Starting from the error signal, the gain control signal is generated, which controls the gain of the voltage-controlled amplifier. Instead of using a constant control rate as in prior art solutions, according to the invention, the control rate is varied as a function of the VCA output signal's magnitude. In case the magnitude of the VCA output signal is small, the control rate is set to a low value. By slowly adjusting the amplifier's gain, signal distortions can be avoided. Such signal distortions occur when the gain regulation starts compensating the amplitude modulation. When the magnitude of the VCA output signal gets close to the saturation region of the ADC, errors due to saturation are likely to occur. In this case, it is desirable to reduce the gain more quickly. According to the invention, the control rate is increased when the VCA output signal increases and gets close to the saturation range. Thus saturation of the analog-digital converters can be avoided.

Preferably, said means for generating an error signal subtract said predefined reference magnitude from said magnitude of the VCA output signal, or vice versa, to generate said error signal. Thus, the error signal is a measure for the deviation of the VCA output signal from its desired value. The difference between the VCA output signal and the reference magnitude is well-suited as a starting point for generating the gain control signal.

Preferably, said means for varying the control rate of the closed-loop control circuit comprise a multiplier element for multiplying said error signal with a scaling factor, whereby the scaling factor is increased with increasing magnitude of the VCA output signal. By multiplying the error signal with a scaling factor, it is possible to influence the speed of regulation of the closed-loop control circuit. The bigger the scaling factor is chosen, the faster the gain is adjusted. This corresponds to a short time constant of the closed-loop control circuit. Vica versa, by means of a small scaling factor, it is possible to slow down the control rate of the closed-loop control circuit. In this case, the time constant of the control circuit is large. In order to avoid signal distortion, the gain should be adjusted slowly during regular operation of the automatic gain control. A different situation arises if the VCA output signal becomes too large. In order to avoid saturation of the analog-digital converter, the gain should be reduced quickly. For this purpose, the scaling factor is increased as soon as the VCA output signal becomes too large. Multiplying the error signal with a scaling factor is the easiest and most effective method for varying the control rate of the control circuit.

Preferably, said means for varying the control rate of the closed-loop control circuit compare said magnitude of the VCA output signal with a predefined boost offset, whereby in case said magnitude is smaller than said boost offset, said scaling factor is set to a default value. For magnitudes of the VCA output signal which are below the boost offset, it is advantageous if the gain is slowly adjusted. The scaling factor is therefore set to a small default value.

Preferably, said means for varying the control rate of the closed-loop control circuit compare said magnitude of the VCA output signal with a predefined boost offset, whereby in case said magnitude exceeds said boost offset, said scaling factor is increased in accordance with the increase of said magnitude of the VCA output signal. As soon as the magnitude of the VCA output signal exceeds the boost offset, it is desirable to quickly reduce the gain of the voltage-controlled amplifier. This is achieved by increasing the scaling factor.

Preferably, said forward controlling element comprises an integrator for integrating the scaled error signal. The error signal is a measure for the deviation of the VCA output signal's magnitude from the desired magnitude. By integration of the error signal, which might have been multiplied with a scaling factor, the gain control signal is obtained.

According to a preferred embodiment of the invention, said integrator comprises adder means for repeatedly adding the scaled error signal, either with positive or with negative sign, to the preceding gain control value. By repeatedly adding the scaled error signal, the integrator generates the gain control signal. In case the gain control signal is too large, it will be decreased in the next iteration by adding the scaled error signal. In case the gain control signal is to low, it will be increased in the next iteration.

Preferably, the automatic gain control unit comprises an analog-digital converter which converts the analog VCA output signal into a digital VCA output signal. Said digital VCA output signal can be transformed, by means of digital signal processing including the determination of the absolute value, adding, subtracting, integrating etc. into a digital gain control signal.

Preferably, the automatic gain control unit comprises a digital-analog converter which converts the digital gain control signal into an analog gain control signal. The gain of the voltage-controlled amplifier is determined by an analog voltage. Therefore, the digital gain control signal has to be converted into an analog gain control signal, which is utilized for controlling the amplifier's gain.

According to a preferred embodiment of the invention, said means for generating an error signal, said forward controlling element, and said means for varying the control rate of the closed-loop control circuit are at least in part realized as digital signal processing units. In digital signal processing, it is possible to implement operations that are very hard to realize by means of analog circuitry. For this reason, it is advantageous to realize at least a part of the closed-loop control circuit in digital technology.

Preferably, said means for generating an error signal, said forward controlling element, and said means for varying the control rate of the closed-loop control circuit are at least in part realized by means of digital signal processing.

Preferably, a receiver with an automatic gain control unit according to the invention receives radio signals according to one of the standards DRM, DAB, FM, or AM. According to the transmission standards FM and AM, the radio receiver performs digital processing of the received radio signals, which are still transmitted as analog signals. DRM (Digital Radio Mondial) and DAB (Digital Audio Broadcasting) are the current standards for digital radio signal transmission.

The inventive method for controlling the gain of a voltage-controlled amplifier, which amplifies a VCA input signal in order to obtain a VCA output signal, with the gain of said voltage-controlled amplifier being controlled by a closed-loop control circuit, comprises a step of generating an error signal by comparing the magnitude of the VCA output signal with a predefined reference magnitude. Then, the error signal is transformed into a gain control signal for the voltage-controlled amplifier. The control rate of the closed-loop control circuit is varied according to the magnitude of the VCA output signal, whereby the control rate is increased with increasing magnitude of the VCA output signal.

Further features and advantages of a preferred embodiment according to the present invention will be explained below in conjunction with the accompanying drawings, in which FIG. 1 shows a block diagram of the automatic gain control unit according to the invention;

FIG. 2 gives a more detailed block diagram of the digitally controlled AGC, showing the structure of the time constant control;

Figure 1:
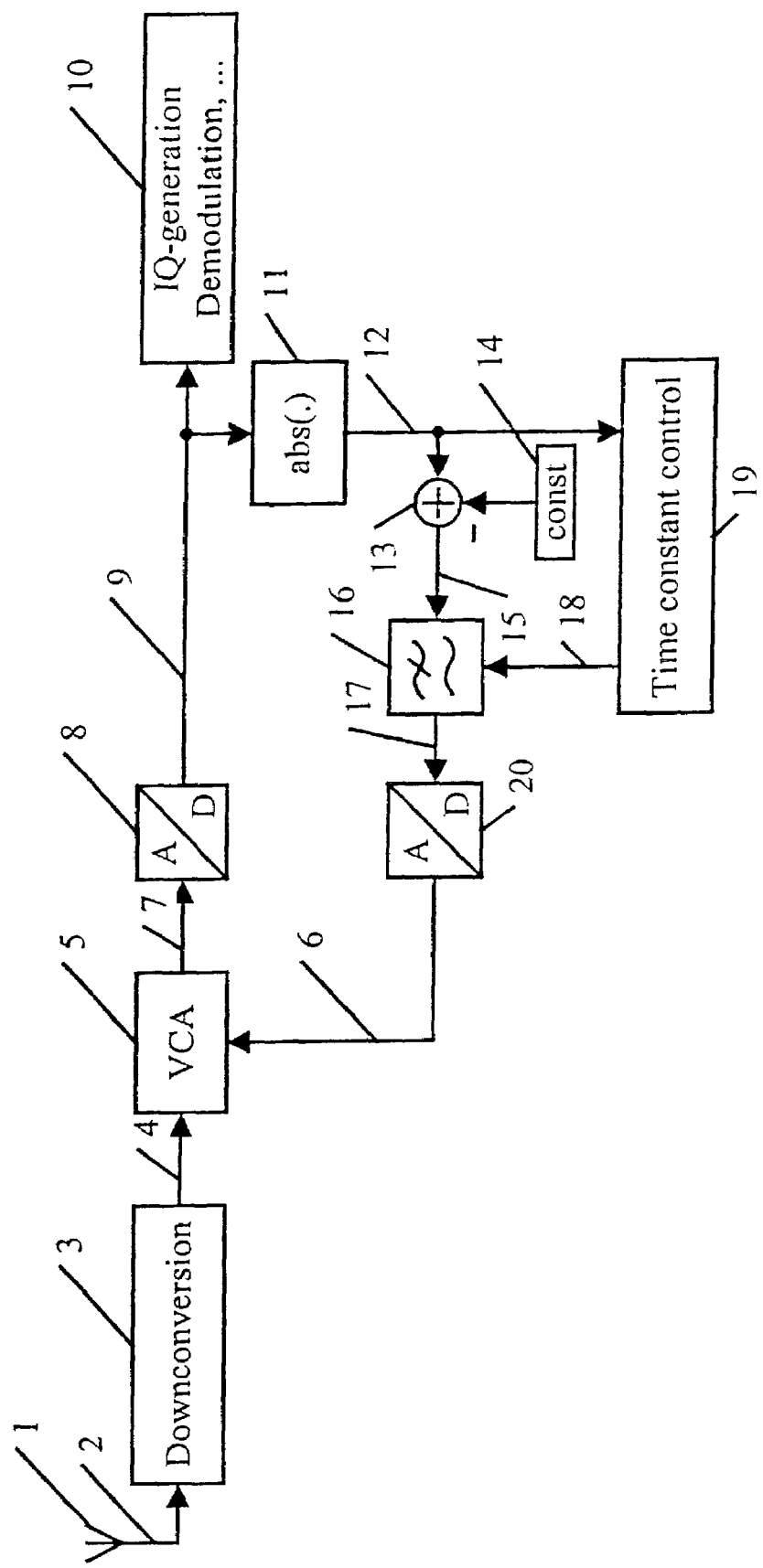
FIG. 1 shows the structure of the automatic gain control unit according to the invention, in which the gain of a voltage-controlled amplifier (VCA) is controlled by a closed-loop control circuit. Automatic gain control units are used e.g. in radio receivers in order to provide subsequent functional units, such as the demodulation unit, with a signal of constant magnitude.

The antenna 1 receives a HF signal 2, which is forwarded to the downconversion unit 3. The downconversion unit 3 transforms the HF signal 2 to an intermediate frequency and generates the VCA input signal 4. This signal is amplified by the voltage-controlled amplifier 5, whereby the magnitude of the analog gain control signal 6 determines the gain of the voltage-controlled amplifier 5. The analog VCA output signal 7 is at the same time the input signal of the analog-digital converter 8, which generates the digital VCA output signal 9. The digital VCA output signal 9 is forwarded to the subsequent functional units 10 of the receiver, which comprise e.g. a unit for generating an inphase and a quadrature signal, a demodulation unit, etc.

The aim is to control the gain of the voltage-controlled amplifier in a way that saturation of the analog-digital converter 8 is avoided. The digital VCA output signal 9 is forwarded to the absolute value determination unit 11, which determines the magnitude 12 of said digital VCA output signal 9. While the digital VCA input signal may either have a positive sign or a negative sign, the magnitude 12 always has a positive sign. In the adder 13, the predefined reference magnitude 14 is subtracted from said magnitude 12 of the VCA output signal. As a result of the subtraction, the adder 13 provides an error signal 15 indicating the deviation of the VCA output signal's magnitude 12 from the reference magnitude 14. The error signal 15 is filtered by the digital low-pass filter 16, which generates the digital gain control signal 17. The time constant 18 is provided by the time constant control 19, which forwards said time constant 18 to the digital low-pass filter 16. The time constant 18 defines how fast the error signal 15 is converted into a corresponding change of the digital gain control signal 17. According to the invention, the time constant 18 is a function of the magnitude 12 of the VCA output signal. In case the VCA output signal 7 is rather small, the analog-digital converter 8 is far from saturation. In this case, it is advantageous to operate with a large time constant, which only allows for a slow variation of the voltage-controlled amplifier's gain. This usually reduces distortions in the decoded or demodulated signal, because fast changes of the VCA output signal 7 are avoided.

As soon as the VCA output signal 7 gets close to the saturation level of the analog-digital converter 8, it should be possible to vary the gain of the voltage-controlled amplifier more quickly. This allows to quickly reduce the amplifier's gain in order to avoid saturation. According to the invention, the control rate of the closed-loop control circuit is increased when the analog VCA output signal 7 approaches the saturation region. In order to speed up the gain control in this case, the time constant control 19 monitors the magnitude 12 of the VCA output signal and decreases the time constant 18 when said magnitude 12 becomes to large. The time constant 18 is forwarded to the digital low-pass filter 16.

By means of the digital-analog converter 20, the digital gain control signal 17 is converted into the analog gain control signal 6, which is used for controlling the gain of the voltage-controlled amplifier 5.

Figure 2:
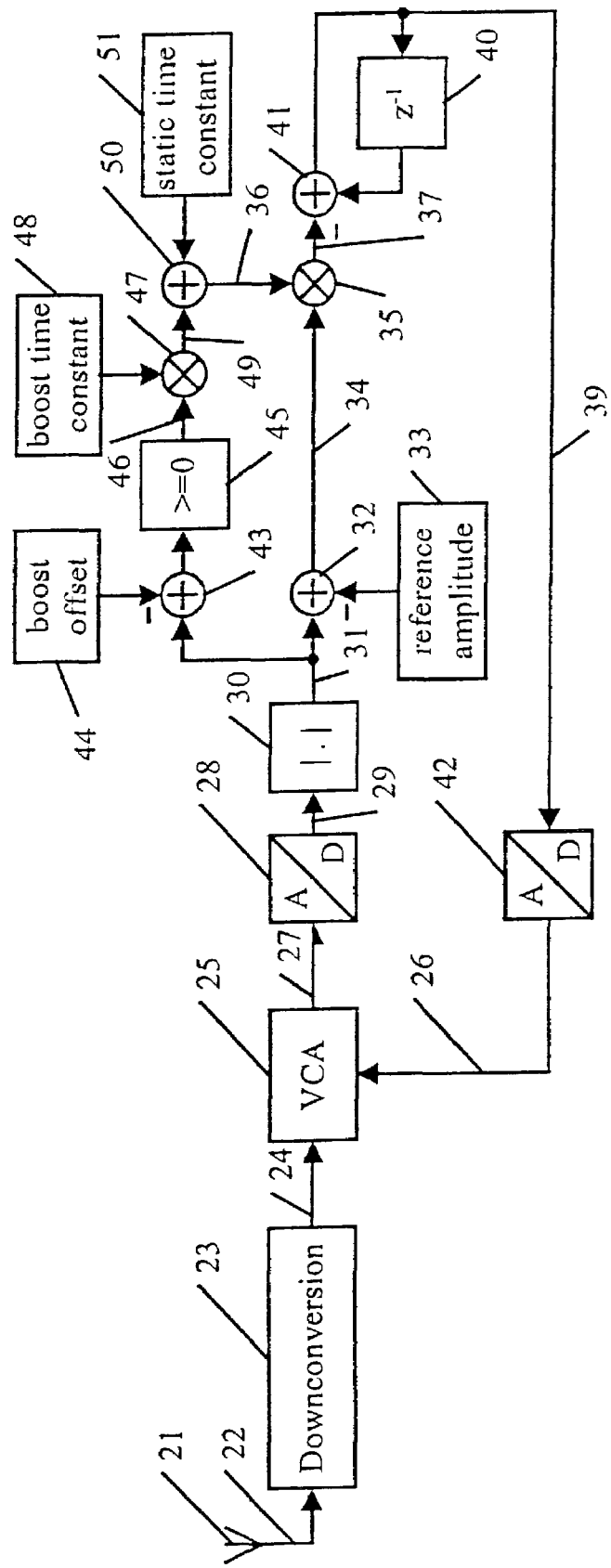

In FIG. 2, a more detailed block diagram of an automatic gain control circuit according to the invention is shown. The HF signal 22 is received via the antenna 21. In the downconversion unit 23, the HF signal 23 is converted into an intermediate frequency signal, which is the VCA input signal 24. The voltage-controlled amplifier 25 amplifies the VCA input signal 24, whereby the gain of the amplifier is determined by the analog gain control signal 26. The analog-digital converter 28 converts the analog VCA output signal 27 into the digital VCA output signal 29, which is forwarded to the absolute value determination unit 30. The absolute value determination unit 30 evaluates the digital VCA output signal 29 and generates the magnitude 31 of the VCA output signal.

Said magnitude 31 is needed both for the time constant control and for the determination of the error signal.

In the adder 32, the reference magnitude 33, is subtracted from the magnitude 31 of the VCA output signal. As a result of this subtraction, the error signal 34 is generated. The error signal 34 indicates how much the magnitude of the VCA output signal deviates from the desired reference magnitude 33. The bigger the error signal 34 is, the more the amplifier's gain will have to be changed.

In order to generate the digital gain control signal 39, the error signal 34 is forwarded, via the multiplier 35, to the integrator comprising a register 40 and an adder 41. The multiplier 35 multiplies the error signal 34 with the scaling factor 36 to obtain the scaled error signal 37. The integrator performs an integration of the scaled error signal 37 and generates the digital gain control signal 39.

The integrator comprises a register 40 for storing the preceding gain control value, and an adder 41. The scaled error signal 37 is forwarded to the adder 41 with a negative sign, because in case the magnitude 31 of the VCA output signal is larger than the reference magnitude 33, the digital gain control signal has to be decreased. Therefore, the new gain control value is calculated by subtracting the scaled error signal 37 from the preceding gain control value, which is obtained from the register 40. The digital gain control signal 39 which appears at the output of the adder 41 is forwarded to the digital-analog-converter 42. Besides that, the new gain control value is written to the register 40. The digital-analog converter 42 converts the digital gain control signal 39 into the analog gain control signal 26, which controls the gain of the voltage-controlled amplifier 25. Depending on the characteristics of the VCA, the sign of the scaled error signal 37 at the input of the adder 41 might be changed.

The scaling factor 36 determines the time constant of the closed-loop control circuit. If the scaling factor 36 has a small value, the scaled error signal 37 will also assume a small value. With each iteration of the integrator, the gain control value will only be changed by a small amount. A small value of the scaling factor 36 causes a rather slow response of the closed-loop control circuit. Therefore, a small value of the scaling factor 36 corresponds to a large time constant of the control circuit, and to a low control rate.

If the value of the scaling factor 36 is large, the scaled error signal 37 becomes large as well. The adder 41 subtracts the scaled error signal 37 from the preceding gain control value. Because of the large scaling factor 36, the gain control value is changed considerably with each iteration of the integrator. The magnitude 31 of the VCA output signal converges quickly towards the desired reference magnitude 33. Therefore, a large value of the scaling factor 36 corresponds to a small time constant of the closed-loop control circuit, and to a high control rate.

For calculating the scaling factor 36, the magnitude 31 of the VCA output signal is compared to a predefined boost offset 44. The boost offset 44 defines a threshold for the behaviour of the closed-loop control circuit. In case the magnitude 31 of the VCA output signal is smaller than the boost offset, the amplifier's gain is regulated slowly, in order to avoid signal distortion. As soon as the magnitude 31 of the VCA output signal becomes larger than the boost offset, the speed of regulation is increased by increasing the scaling factor 36.

In order to compare the magnitude 31 of the VCA output signal with the boost offset 44, the adder 43 subtracts the boost offset 44 from the magnitude 31 of the VCA output signal. The resulting signal is forwarded to the limiter 45. In case the magnitude 31 of the VCA output signal is smaller than the boost offset 44, the output signal 46 of the limiter becomes zero. In case the magnitude 31 is larger than the boost offset 44, the output signal 46 of the limiter assumes a positive value.

The multiplier 47 multiplies the output signal 46 with a boost time constant 48 to generate the multiplied signal 49. In the adder 50, the multiplied signal 49 and the static time constant 51 are added together. Thus, the scaling factor 36 is generated, which is forwarded to the multiplier 35.

In case the magnitude 31 is smaller than the boost offset 44, the output signal 46 is equal to zero, and therefore, also the multiplied signal 49 is equal to zero. The multiplied signal 49 does not provide a contribution to the scaling factor 36. The scaling factor 36 is therefore equal to the static time constant 51, which is a rather small default value. This leads to a rather slow regulation behaviour of the closed-loop control circuit.

As soon as the magnitude 31 exceeds the boost offset 44, the output signal 46 of the limiter assumes a value greater than zero. This value is multiplied by the boost time constant 48, in order to provide the multiplied signal 49. For large magnitudes 31 of the VCA output signal, both the multiplied signal 49 and the static time constant 51 provide a contribution to the scaling factor 36, which gets rather large. The regulation speed of the closed-loop control circuit is therefore considerably increased as soon as the magnitude 31 starts to exceed the boost offset 44.

Figure 3:
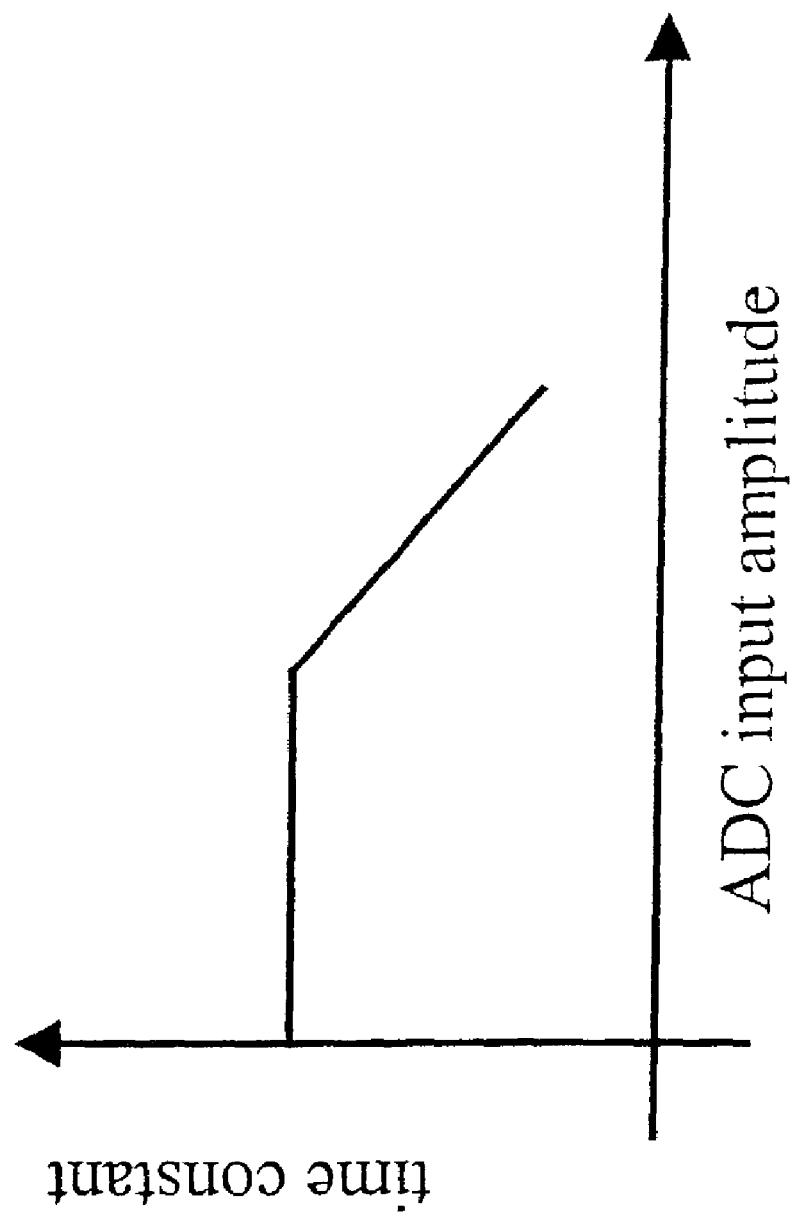
FIG. 3 shows how the time constant depends on the input amplitude of the analog-digital converter.

This can also be seen in FIG. 3, which shows the time constant of the closed-loop control circuit as a function of the magnitude 31 of the VCA output signal, which is equal to the input amplitude of the analog-digital converter 28. For small values of the magnitude 31, the control circuit's time constant is large. As soon as the magnitude 31 becomes larger than the boost offset 44, which is indicated as a dashed line in FIG. 3, the scaling factor 36 increases, and the time constant of the control circuit decreases.

The invention claimed is:

1. An automatic gain control unit, comprising:
a voltage-controlled amplifier which amplifies a VCA input signal in order to obtain a VCA output signal, with the gain of said voltage-controlled amplifier being controlled by a closed-loop control circuit,
means for generating an error signal by comparing the magnitude of the VCA output signal with a predefined reference magnitude,
a forward controlling element which transforms the error signal into a gain control signal for the voltage-controlled amplifier, and
means for varying the control rate of the closed-loop control circuit according to the magnitude of the VCA output signal for changing the time constant of the control rate, the control rate being increased with increasing magnitude of the VCA output signal, said means for varying the control rate of the closed-loop control circuit including a multiplier element for multiplying said error signal with a scaling factor, the scaling factor being increased with increasing magnitude of the VCA output signal, and said means for varying the control rate of the closed-loop control circuit comparing said magnitude of the VCA output signal with a predefined boost offset, whereby in case said magnitude exceeds said boost offset, said scaling factor is increased in accordance with the increase of said magnitude of the VCA output signal to decrease the time constant of the control rate.

2. The automatic gain control unit according to claim 1, wherein said means for generating an error signal subtracts said predefined reference magnitude from said magnitude of the VCA output signal, or vice versa, to generate said error signal.

3. The automatic gain control unit according to claim 1, wherein means for varying the control rate of the closed-loop control circuit compares said magnitude of the VCA output signal with a predefined boost offset, whereby in case said magnitude is smaller than said boost offset, said scaling factor is set to a default value.

4. The automatic gain control unit according to claim 1, wherein forward controlling element includes an integrator configured to integrate the scaled error signal.

5. The automatic gain control unit according to claim 4, wherein said integrator includes adder means for repeatedly adding the scaled error signal, either with a positive or with a negative value, to the preceding gain control value.

6. The automatic gain control unit according to claim 1, further comprising an analog-digital converter which converts the analog VCA output signal into a digital VCA output signal.

7. The automatic gain control unit according to claim 1, further comprising a digital-analog converter which converts the digital gain control signal into a analog gain control signal.

8. The automatic gain control unit according to claim 1, wherein said means for generating an error signal, said forward controlling element, and said means for varying the control rate of the closed-loop control circuit are at least in part embodied as digital signal processing units.

9. A receiver comprising:
a voltage-controlled amplifier which amplifies a VCA input signal in order to obtain a VCA output signal, with the gain of said voltage-controlled amplifier being controlled by a closed-loop control circuit,
means for generating an error signal by comparing the magnitude of the VCA output signal with a predefined reference magnitude,
a forward controlling element which transforms the error signal into a gain control signal for the voltage-controlled amplifier, and
means for varying the control rate of the closed-loop control circuit according to the magnitude of the VCA output signal for changing the time constant of the control rate, the control rate being increased with increasing magnitude of the VCA output signal, said means for varying the control rate of the closed-loop control circuit including a multiplier element for multiplying said error signal with a scaling factor, the scaling factor being increased with increasing magnitude of the VCA output signal, and said means for varying the control rate of the closed-loop control circuit comparing said magnitude of the VCA output signal with a predefined boost offset, whereby in case said magnitude exceeds said boost offset, said scaling factor is increased in accordance with the increase of said magnitude of the VCA output signal to decrease the time constant of the control rate.

10. A receiver according to claim 9, wherein radio signals are received according to one of DRM, DAB, FM, or AM.

11. A method for controlling the gain of a voltage-controlled amplifier, which amplifies a VCA input signal in order to obtain a VCA output signal, with the gain of said voltage-controlled amplifier being controlled by a closed-loop control circuit, comprising steps of:
generating an error signal by comparing the magnitude of the VCA output signal with a predefined reference magnitude,
transforming the error signal into a gain control signal for the voltage-controlled amplifier,
varying the control rate of the closed-loop control circuit according to the magnitude of the VCA output signal for changing the time constant of the control rate, the control rate being increased with increasing magnitude of the VCA output signal,
multiplying said error signal with a scaling factor, the scaling factor being increased with increasing magnitude of the VCA output signal, and
comparing said magnitude of the VCA output signal with a predefined boost offset, whereby in case said magnitude exceeds said boost offset, said scaling factor is increased in accordance with the increase of said magnitude of the VCA output signal to decrease the time constant of the control rate.

12. The method according to claim 11, further comprising:
subtracting said predefined reference magnitude from said magnitude of the VCA output signal, or vice versa, to generate said error signal.

13. The method according to claim 11, further comprising:
comparing said magnitude of the VCA output signal with a predefined boost offset, whereby in case said magnitude is smaller than said boost offset, said scaling factor is set to a default value.

14. The method according to claim 11, further comprising:
integrating the scaled error signal, in order to generate said gain control signal.

15. The method according to claim 14, further comprising:
repeatedly adding the scaled error signal, either with a positive or with a negative value, to the preceding gain control value, in order to generate said gain control signal.

16. The method according to claim 11, further comprising:
converting the analog VCA output signal into a digital VCA output signal.

17. The method according to claim 11, further comprising:
converting the digital gain control signal into an analog gain control signal.

18. An automatic gain control unit, comprising:
a voltage-controlled amplifier configured to amplify a VCA input signal in order to obtain a VCA output signal, with the gain of said voltage-controlled amplifier being controlled by a closed-loop control circuit;
an error signal generation unit configured to compare the magnitude of the VCA output signal with a predefined reference magnitude;
a forward controlling element configured to transform the error signal into a gain control signal for the voltage-controlled amplifier; and
a control rate variation unit of the closed-loop circuit which varies the control rate of the closed-loop circuit according to the magnitude of the VCA output signal for changing the time constant of the control rate, the control rate being increased with increasing magnitude of the VCA output signal, the control rate varying unit including a multiplier element for multiplying said error signal with a scaling factor, the scaling factor being increased with increasing magnitude of the VCA output signal, the control rate variation unit varying the control rate of the closed-loop control circuit by comparing said magnitude of the VCA output signal with a predefined boost offset, whereby in case said magnitude exceeds said boost offset, said scaling factor is increased in accordance with the increase of said magnitude of the VCA output signal to decrease the time constant of the control rate.

* * * * *